(12) United States Patent
Chen

(10) Patent No.: US 6,639,804 B1
(45) Date of Patent: Oct. 28, 2003

(54) ADJUSTABLE DEVICE FOR HEAT SINK RETENTION MODULE

(75) Inventor: Yun Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/291,051

(22) Filed: Nov. 8, 2002

(30) Foreign Application Priority Data

Jun. 28, 2002 (TW) ...................................... 91209760 U

(51) Int. Cl.[7] ................................................ H05K 7/20
(52) U.S. Cl. ........................ 361/719; 361/704; 361/709; 361/752; 174/50.54; 165/80.3; 165/185
(58) Field of Search .............................. 361/704, 709, 361/719–721, 752; 174/50.54, 60, 67; 165/80.3, 185

(56) References Cited

U.S. PATENT DOCUMENTS 5,661,640 A * 8/1997 Mills et al. ................. 361/801
5,673,176 A * 9/1997 Penniman et al. .......... 361/687
6,252,768 B1 * 6/2001 Lin ............................. 361/687
6,282,093 B1 * 8/2001 Goodwin .................... 361/704
6,424,538 B1 * 7/2002 Paquin ....................... 361/752

\* cited by examiner

*Primary Examiner*—Boris Chervinsky
(74) *Attorney, Agent, or Firm*—Wei Te Chung

(57) ABSTRACT

An adjustable device includes a supporting plate (20) and a securing plate (10). The supporting plate includes a locking block (204) and three latches (208). The locking block defines three locking holes (205). The latches include a left latch, a right latch, and a front latch disposed forwardly of the left and right latches. Each latch defines a slot (209) and a screw aperture (207). The securing plate includes three fasteners (106) corresponding to the latches. Each fastener defines a through aperture (108). The securing plate defines a through hole (105). The position of the securing plate secured to the supporting plate is adjustable by a selected fastener being selectively engaged in the slot of a corresponding latch, a screw (30) extending through the through hole to engage in a corresponding locking hole, and another screw (30) extending through a through aperture to engage in a corresponding screw aperture.

19 Claims, 7 Drawing Sheets

ADJUSTABLE DEVICE FOR HEAT SINK RETENTION MODULE

BACKGROUND OF THE INVENTION

1. Field of the Invention

The present invention relates to adjustable devices used in apparatuses such as computers, and particularly to adjustable devices that allow a heat sink retention module to fit different circuit boards in a computer.

2. Prior Art

With rapid development of the computer industry, more and more kinds of mother boards are being produced. Various electronic components such as central processing units (CPUs) are fixed on the mother boards. Positions provided by a mother board for such components are not standardized. For example, CPUs, such as the Pentium 4 by Intel Corporation, are installed on different mother boards in different positions by different manufacturers. In a typical computer, a heat sink and an accompanying retention module are mounted on the mother board with the CPU. Adjustable devices have been developed to provide flexibility of positioning of the retention module on different mother boards. The adjustable devices typically attach the retention module and mother board to the computer enclosure.

FIG. 7 shows a conventional adjustable device, which comprises a supporting plate 10' and a securing plate 20'. The supporting plate 10' forms a plurality of locking blocks 104' thereon. Each locking block 104' defines three first through holes 106'. The securing plate 20' defines a plurality of second through holes 202' corresponding to the locking blocks 104'. A plurality of bolts 206' each have an outer thread in a bottom portion thereof, and an inner thread in a top portion thereof. A mother board 30' defines a plurality of third through holes 32'. Positions for CPUs 50' provided by different mother boards 30' are different. Positions of third through holes 32' on the mother boards 30' are accordingly different. The bolts 206' are extended through selected first through holes 106' of the supporting plate 10' and through the second through holes 202' of the securing plate 20'. The bottom portions of the bolts 206' are engaged with the supporting plate 10' in screw holes (not labeled) that are defined below the first through holes 106'. The screws 40' are extended through the retention module 40' and the third through holes 32' of the mother board 30' to engage with the bolts 206'. The retention module 40', mother board 30' and securing plate 20' are thus secured on the supporting plate 10'. However, the mother board 30' may need repair, maintenance or replacement after a period of time. In such cases, the mother board 30' is detached from the supporting plate 10'. To do this, the securing plate 20' must also be detached from the supporting plate 10'. This is unduly inconvenient and time-consuming. In addition, there is a risk that the loose securing plate 20' will be misplaced. Furthermore, the screw holes (not labeled) of the supporting plate 10' are too together. It is difficult and troublesome to correctly engage the bolts 206' in these screw holes.

SUMMARY OF THE INVENTION

Accordingly, an object of the present invention is to provide an adjustable device for readily and safely securing a mother board to a supporting plate.

To achieve the above-mentioned object, an adjustable device in accordance with the present invention comprises a supporting plate and a securing plate. The supporting plate comprises a locking block and three latches. The locking block defines three locking holes along a length thereof. The locking holes comprise a left locking hole, a middle locking hole, and a right locking hole. The middle locking hole is offset slightly forwardly of both the left and right locking holes. The latches comprise a left latch, a right latch, and a front latch disposed forwardly of the left and right latches. Each latch defines a slot and a screw aperture. The securing plate comprises three fasteners corresponding to the latches, respectively. Each fastener defines a through aperture. The securing plate defines a through hole. The position of the securing plate secured to the supporting plate is adjustable by a selected fastener being selectively engaged in the slot of a corresponding latch, a screw extending through the through hole to engage in a corresponding locking hole, and another screw extending a through aperture to engage in a corresponding screw aperture.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
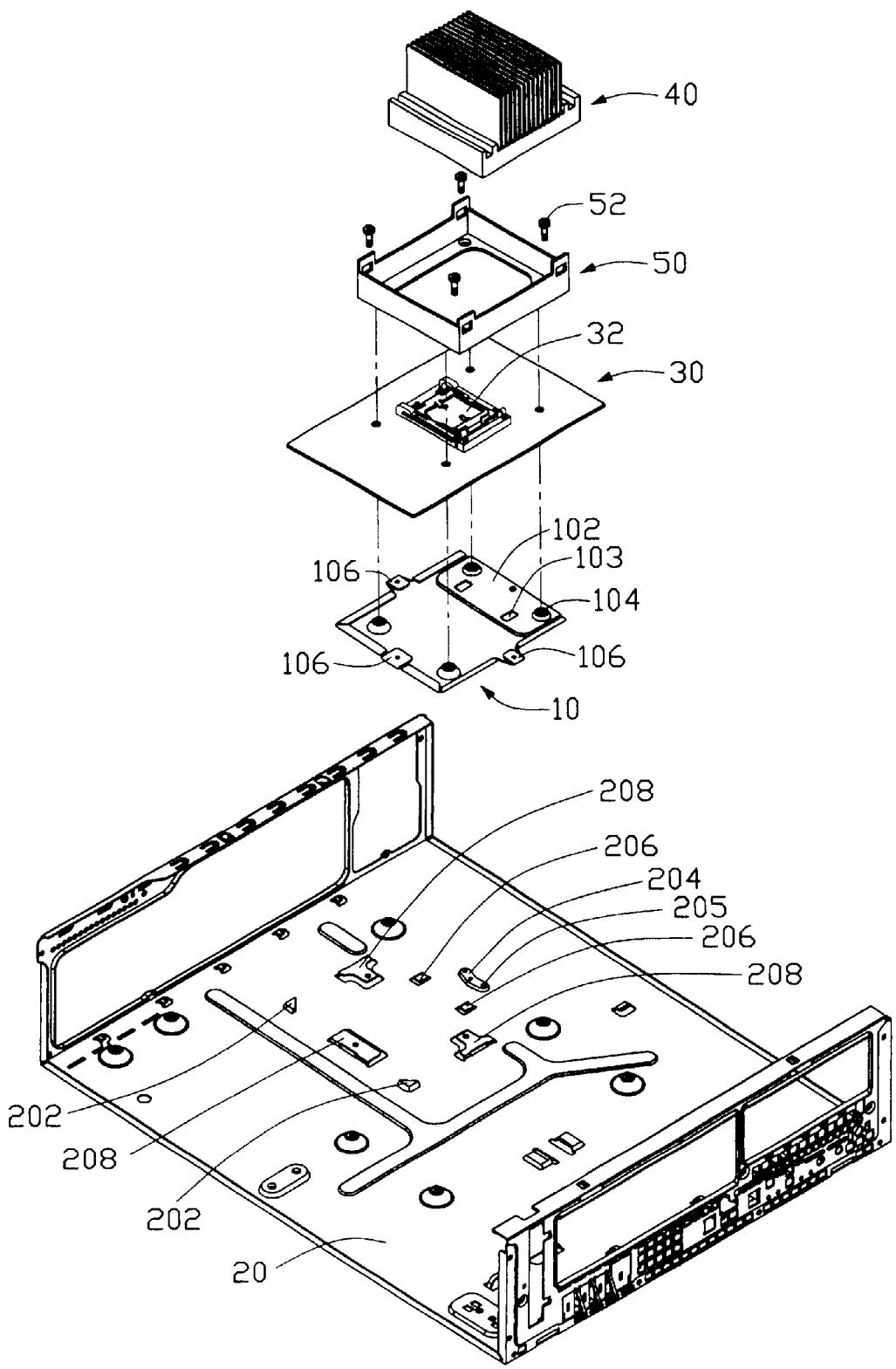
FIG. 1 is an exploded isometric view of an adjustable device in accordance with the present invention, together with a mother board, a retention module and a heat sink.

Referring to FIG. 1, a adjusting device in accordance with a preferred embodiment of the present invention comprises a securing plate 10 and a supporting plate 20. The securing plate 10 is for securing a mother board 30 on which a central processing unit (CPU) 32 is mounted and a retention module 50 on which a heat sink 40 is mounted to the supporting plate 20. Four screws 52 are for securing the retention module 50 and the mother board 30 to the securing plate 10.

Figure 2:
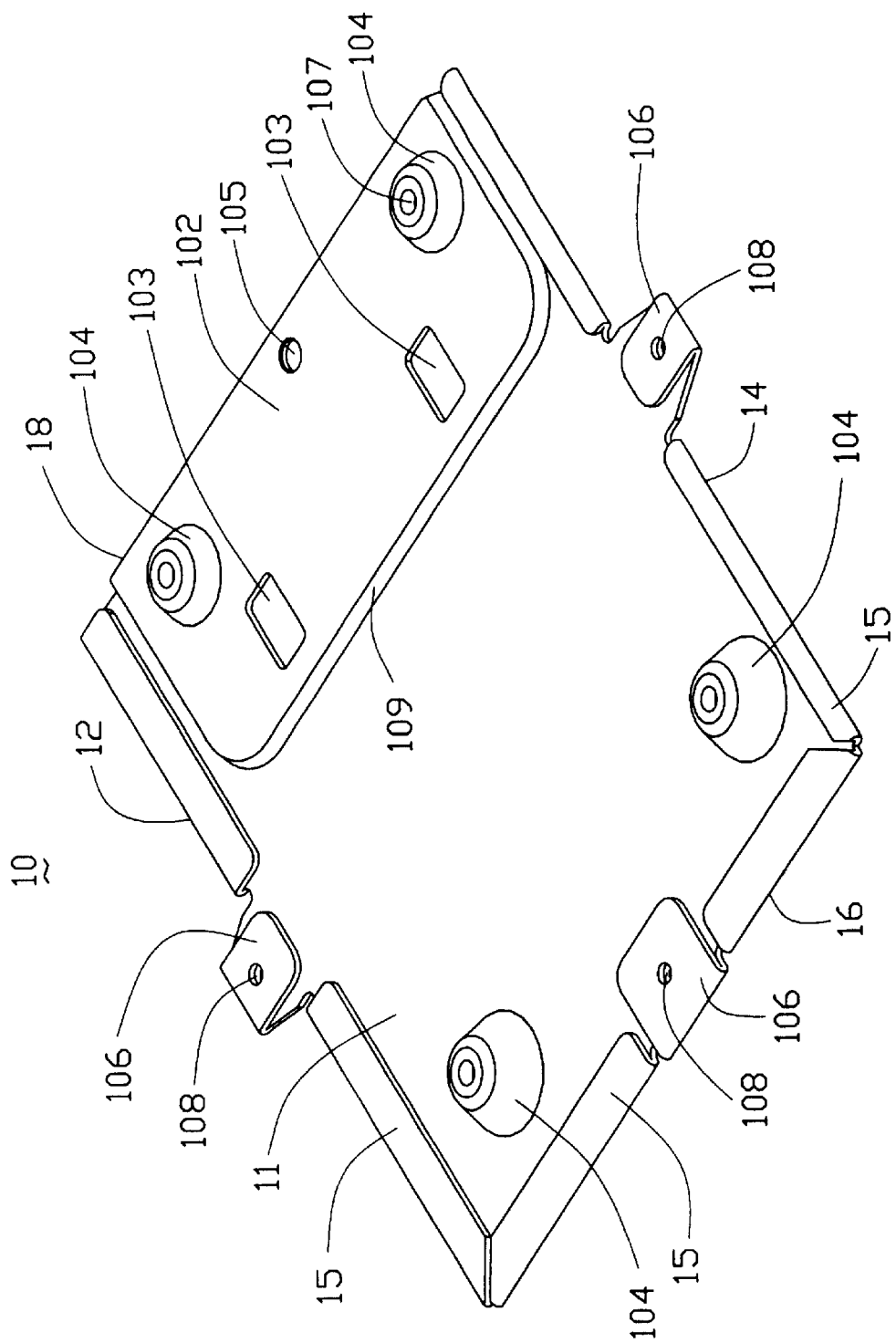
FIG. 2 is an enlarged isometric view of a securing plate of the adjustable device of FIG. 1.

Referring particularly to FIG. 2, the securing plate 10 comprises a rectangular body 11 having four side edges. The side edges are a left side edge 12, a right side edge 14, a front side edge 16, and a rear side edge 18. The left side edge 12 and the right side edge 14 are parallel to each other. The front side edge 16 and the rear side edge 18 are parallel to each other, and are perpendicular to the left and right side edges 12, 14. Portions of the body 11 at the left, right and front side edges 12, 14, 16 are respectively folded back over themselves to form three strips 15. A fastener 106 is formed from the body 11 at a middle portion of each strip 15, and extends coplanarly outwardly from the strip 15. Thus the left, right and front side edges 12, 14, 16 respectively have left, right and front fasteners 106. Each fastener 106 has a V-shaped cross section. A screw aperture 108 is defined in each fastener 106. A portion of the body 11 at the rear side edge 18 is folded back over itself to form a double-thickness portion 102. A pair of spaced cutouts 103 is defined in the double-thickness portion 102 distal from the rear side edge 18; A pair of spaced protrusions 104 is formed on the body 11 near the front side edge 16. Another pair of the protrusions 104 is formed on the double-thickness portion 102 near the rear side edge 18. A screw hole 107 is defined in each protrusion 104, for fixedly receiving a corresponding screw 52. A through hole 105 is defined through the double-thickness portion 102, generally between the protrusions 104 of the double-thickness portion 102.

Figure 3:
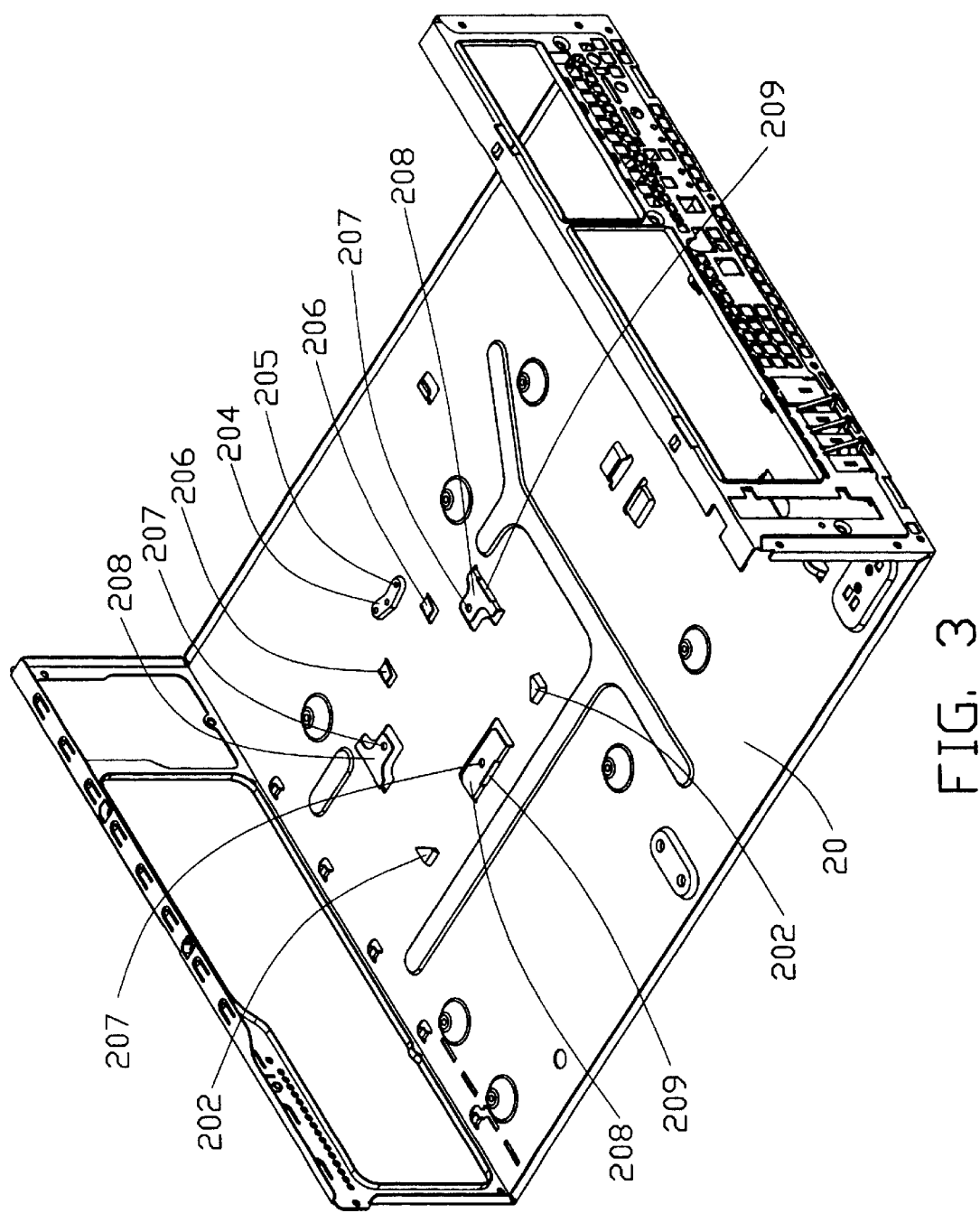
FIG. 3 is an enlarged isometric view of a supporting plate of the adjustable device of FIG. 1.

Referring to FIG. 3, the supporting plate 20 forms three latches 208 thereon, corresponding to the fasteners 106 of the securing plate 10. The latches comprise a front latch 208, a left latch 208, and a right latch 208. The front latch 208 is disposed forwardly of the left and right latches 208. Each latch 208 has an L-shaped cross section. A through aperture 207 is defined in each latch 208. A slot 209 is defined in a portion of each latch 208 where it connects with the supporting plate 20. A left positioning block 202 and a right positioning block 202 are formed on the supporting plate 20 at opposite sides of the front latch 208 respectively, corresponding to opposite ends respectively of the front side edge 16 of the securing plate 10. Each positioning block 202 is generally triangular. A pair of spring tabs 206 extends forwardly and slightly upwardly from the supporting plate 20. The spring tabs 206 are located generally between the rear latches 208, and correspond to the cutouts 103 of the securing plate 10. A locking block 204 is formed on the supporting plate 20 rearwardly of the spring tabs 206, corresponding to the through hole 105 of the securing plate 10. A left locking hole 205, a middle locking hole 205, and a right locking hole 205 are consecutively defined in the locking block 204 along a length thereof. The middle locking hole 205 is offset slightly forwardly of both the left and right locking holes 205.

Figure 4:
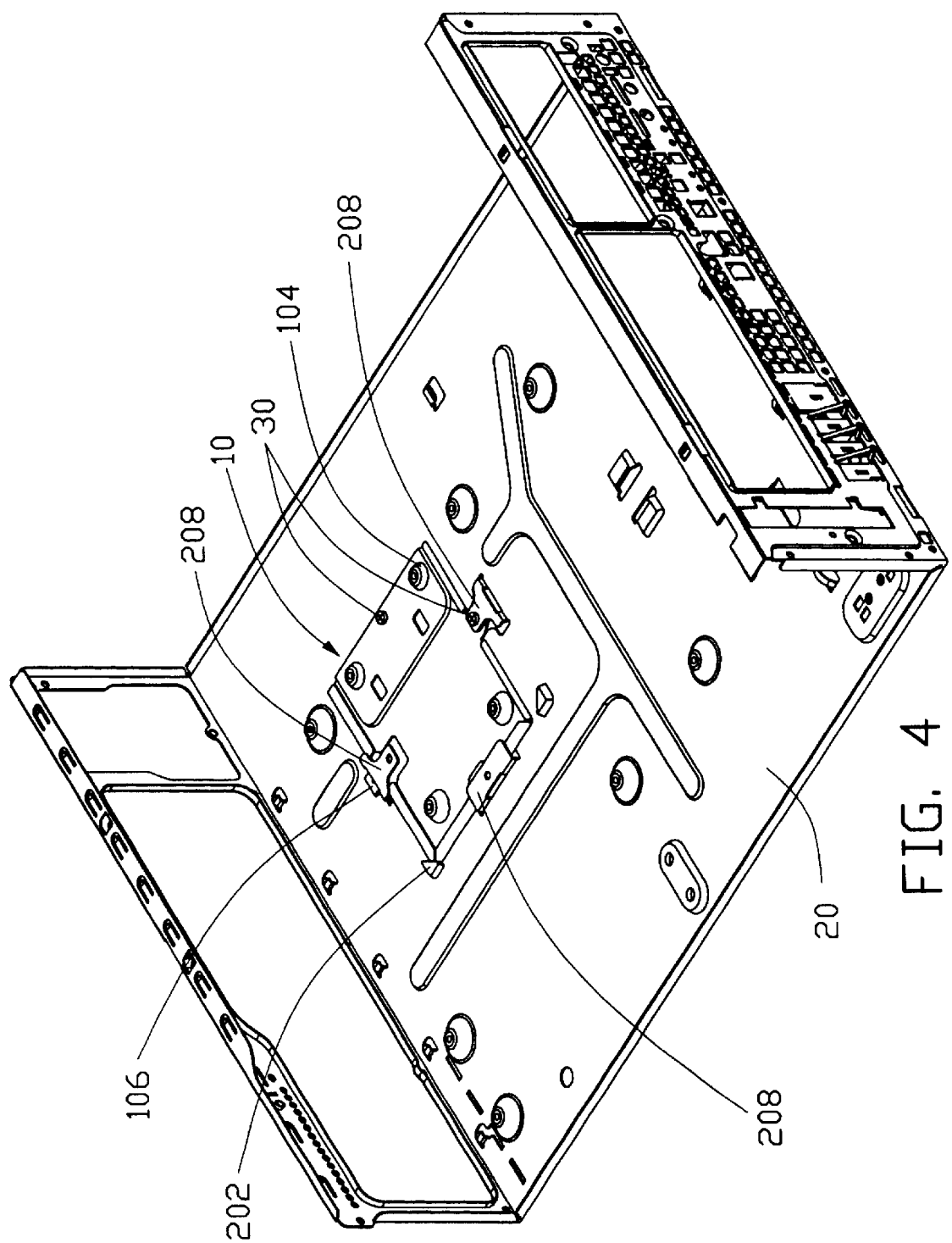
FIG. 4 is an assembled view of the adjustable device of FIG. 1, showing the securing plate secured on the supporting plate at a left position.

Referring to FIG. 4, in assembly, the securing plate 10 is placed on the supporting plate 20 such that it is movably retained between the two rearmost latches 208. When the securing plate 10 is desired to be secured to the supporting plate 20 at a left position, the securing plate 10 is moved leftward until the left side edge 12 abuts the left latch 208 and the left positioning block 202. The left fastener 106 is thus extended through the slot 209 of the left latch 208. The through hole 105 is thus aligned with the left locking hole 205. The screw aperture 108 of the right fastener 106 is aligned with the through aperture 207 of the right latch 208. A screw 30 is extended through the through hole 105 to engage in the left locking hole 205. Another screw 30 is extended through the through aperture 207 of the right latch 208 to engage in the screw aperture 108 of the right fastener 106. Thereafter, the retention module 50 and the mother board 30 are secured to the securing plate 10 by the screws 52 engaging in the screw holes 107 of the protrusions 104 of the securing plate 10.

Figure 5:
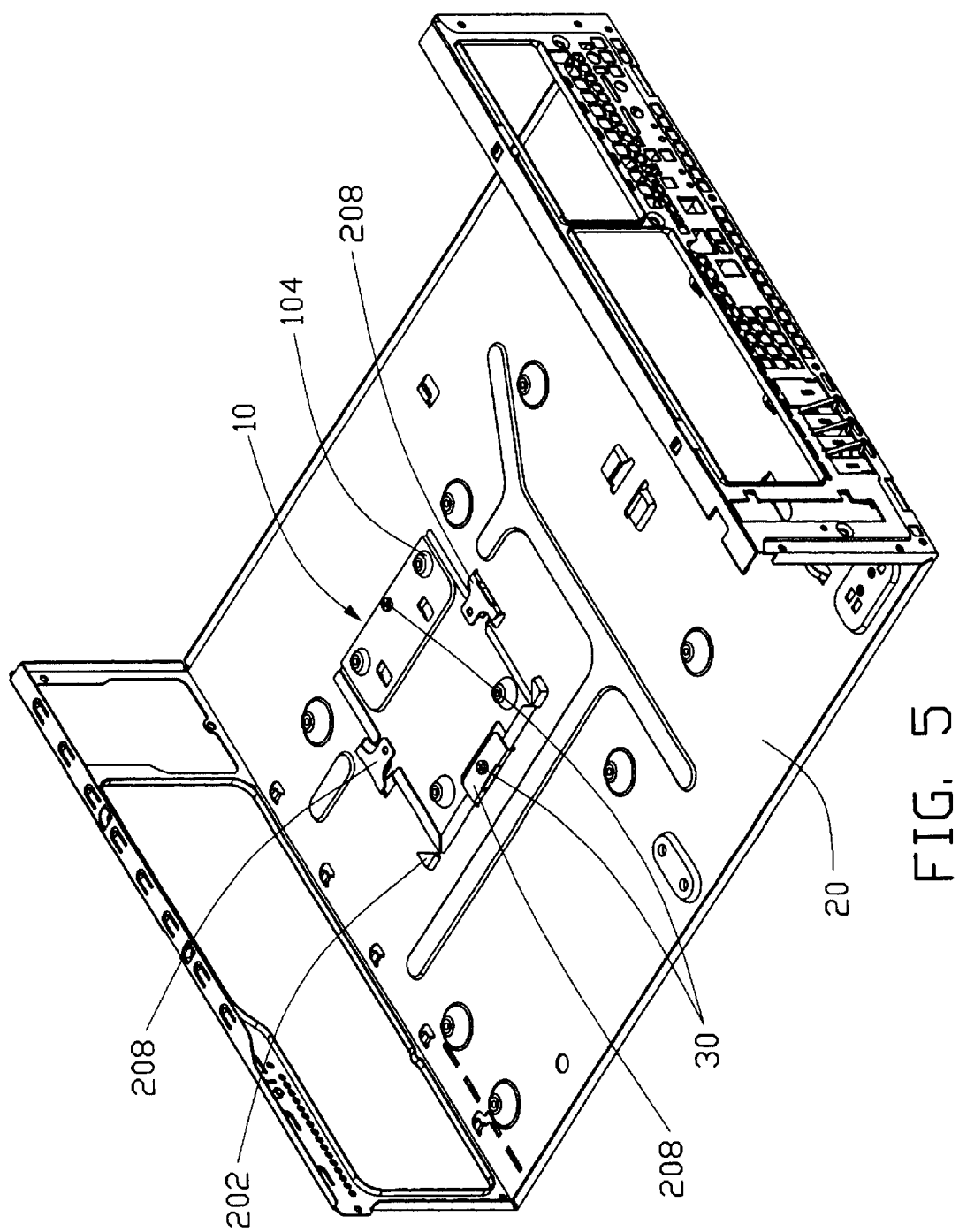
FIG. 5 is similar to FIG. 4, but showing the securing plate secured on the supporting plate at a middle position.

Referring to FIG. 5, when the securing plate 10 is desired to be secured to the supporting plate 20 at a middle position, the securing plate 10 is moved until the front side edge 16 symmetrically abuts the front latch 208. The spring tabs 206 of the supporting plate 20 are received in the cutouts 103 of the securing plate 10. The through hole 105 is aligned with the middle locking hole 205. The screw aperture 108 of the front fastener 106 is aligned with the through aperture 207 of the front latch 208. A screw 30 is extended through the through hole 105 to engage in the middle locking hole 205. Another screw 30 is extended through the through aperture 207 of the front latch 208 to engage in the screw aperture 108 of the front fastener 106. Thereafter, the retention module 50 and the mother board 30 are secured to the securing plate 10 by the screws 52 engaging in the screw holes 107 of the protrusions 104 of the securing plate 10.

Figure 6:
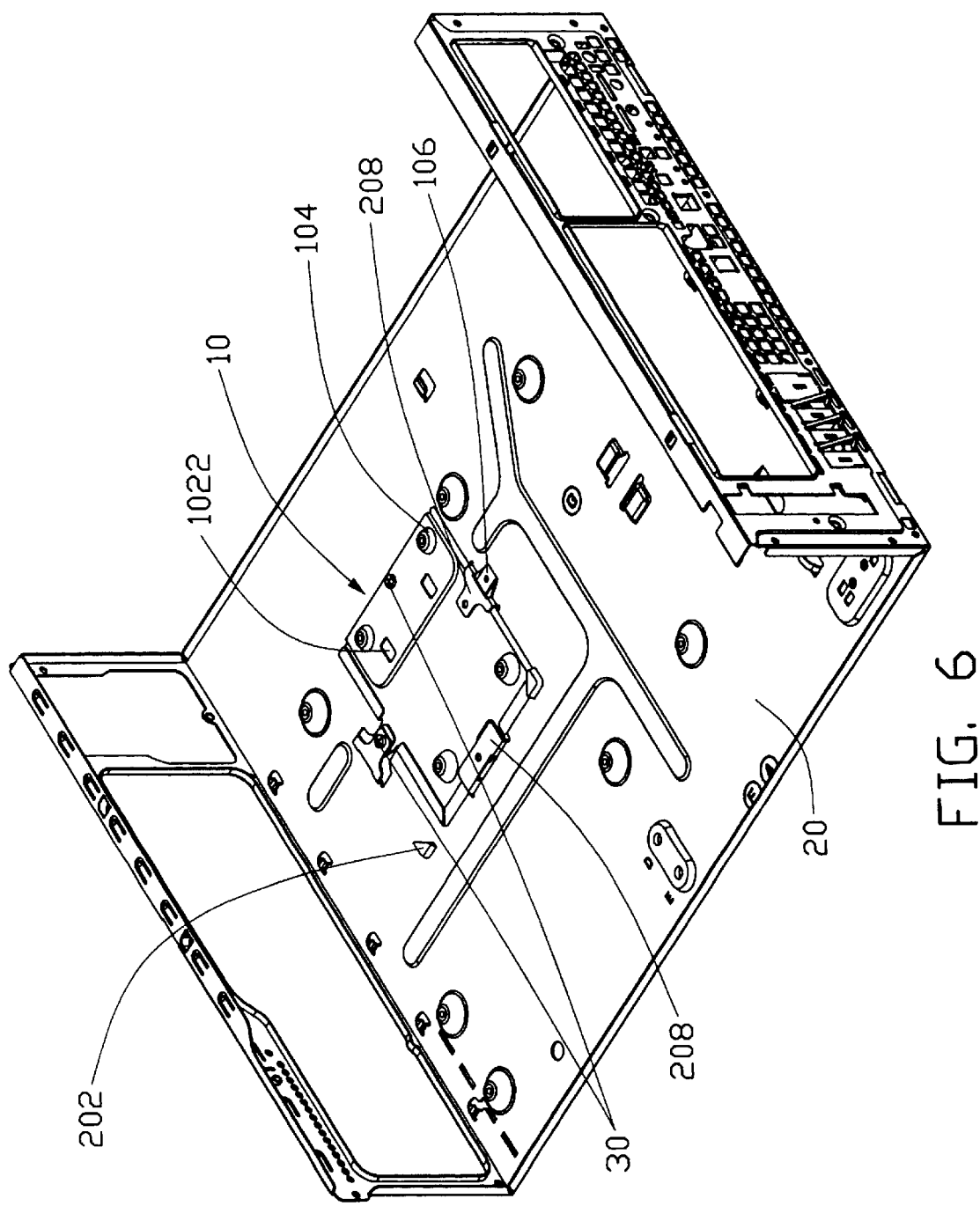
FIG. 6 is similar to FIGS. 4 and 5, but showing the securing plate secured on the supporting plate at a right position.
Figure 7:
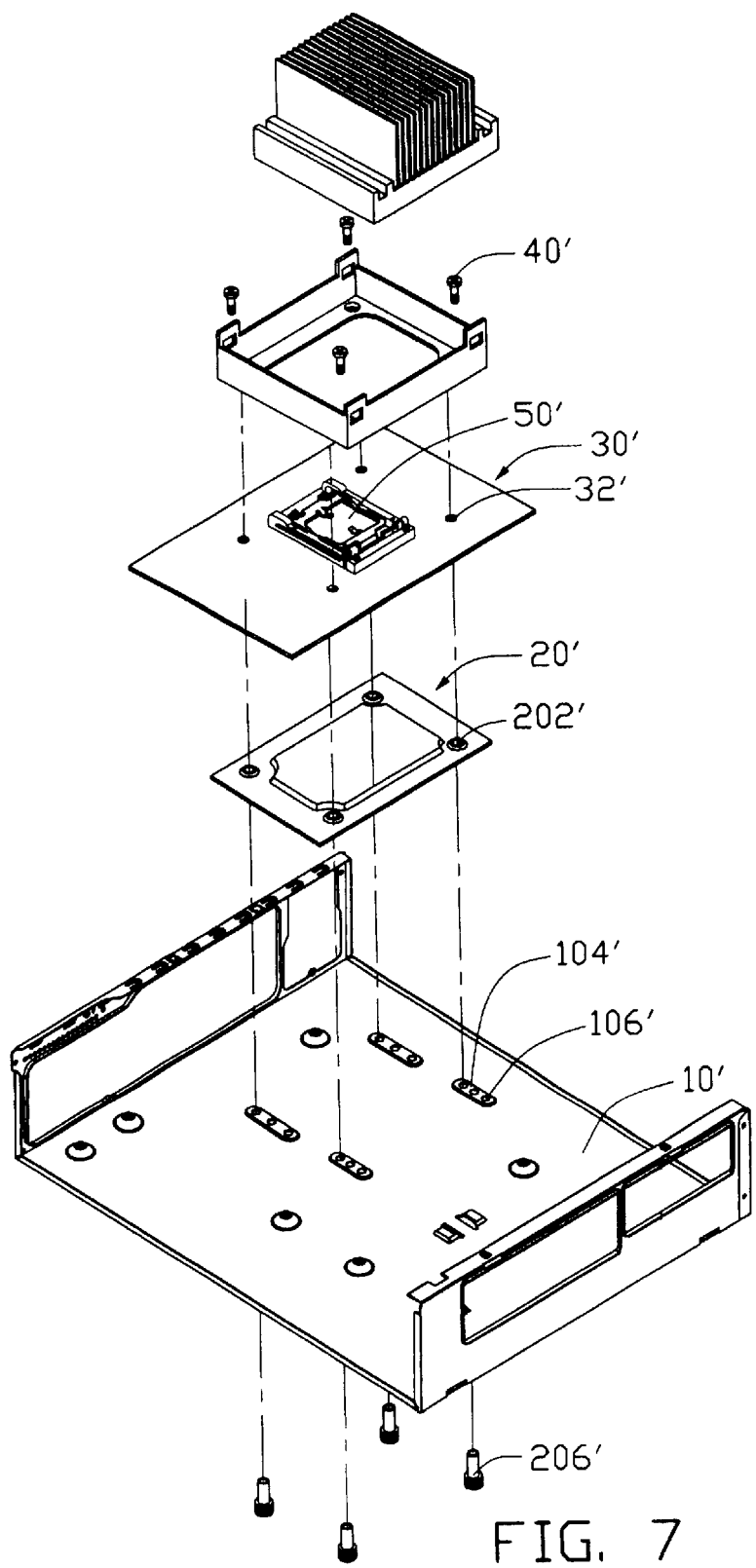
FIG. 7 is an exploded isometric view of a conventional adjustable device, together with a mother board, a retention module and a heat sink.

Referring to FIG. 6, when the securing plate 10 is desired to be secured to the supporting plate 20 at a right position, the securing plate 10 is moved rightward until the right side edge 14 abuts the right latch 208 and the right positioning block 202. The through hole 105 is aligned with the right locking hole 205. The screw aperture 108 of the left fastener 106 is aligned with the through aperture 207 of the left latch 208. A screw 30 is extended through the through hole 105 to engage in the right locking hole 205. Another screw 30 is extended through the through aperture 207 of the left latch 208 to engage in the screw aperture 108 of the left fastener 106. Thereafter, the retention module 50 and the mother board 30 are secured to the securing plate 10 by the screws 52 engaging in the screw holes 107 of the protrusions 104 of the securing plate 10.

In the present invention, the securing plate 10 can be adjustably fixed to the supporting plate 20 at one of three positions, according to the required position of the retention module 50. For example, when the CPU 32 is located on the mother board 30 in a conventional position, the retention module 50 is required to installed on the mother board 30 at a conventional position. The securing plate 10 is accordingly required to be fixed to the supporting plate 20 at a middle position. When the CPU 32 is offset slight leftward on the mother board 30, the retention module 50 is required to offset slight leftward on the mother board 30. The securing plate 10 is accordingly required to be fixed to the supporting plate 20 at a left position. When the CPU 32 is offset slight rightward on the mother board 30, the retention module 50 is required to offset slight rightward on the mother board 30. The securing plate 10 is accordingly required to be fixed to the supporting plate 20 at a right position. When the mother board 30 is required to be detached from the supporting plate 20, the securing plate 10 does not need to be detached from the supporting plate 20. This is most convenient and efficient, and circumvents any risk of the securing plate 10 being misplaced.

It is understood that the invention may be embodied in other forms without departing from the spirit thereof. Thus, the present example and embodiment is to be considered in all respects as illustrative and not restrictive, and the invention is not to be limited to the details given herein.

What is claimed is:
1. An adjustable device comprising:
   a supporting plate comprising a locking block defining a plurality of locking holes, and a plurality of latches corresponding to the locking holes; and
   a securing plate adjustably secured on the supporting plate, the securing plate defining a through hole, and comprising a plurality of fasteners corresponding to the latches, wherein
   a position of the securing plate relative to the supporting plate is adjustable by a selected one of the fasteners being engaged with a selected corresponding latch, and by a fastening element being extended through the through hole and disengagably engaged in a corresponding locking hole.
2. The adjustable device as claimed in claim 1, wherein each of the latches defines a slot receiving a corresponding fastener therethrough.

3. The adjustable device as claimed in claim 2, wherein each of the fasteners defines a screw aperture, and each of the latches defines a through aperture, whereby a screw can be extended through a selected through aperture and engaged in a corresponding screw aperture.

4. The adjustable device as claimed in claim 3, wherein the plurality of latches comprises a front latch, a left latch and a right latch, the plurality of fasteners comprises a front fastener, a left fastener and a right fastener, the plurality of locking holes comprises a middle locking hole, a left locking hole and a right locking hole, and the middle locking hole is disposed forwardly of the left and right locking holes.

5. The adjustable device as claimed in claim 4, wherein when the front fastener is extended through the slot of the front latch, the through hole is aligned with the middle locking hole and the screw aperture of the right fastener is aligned with the through aperture of the right latch.

6. The adjustable device as claimed in claim 4, wherein when the left fastener is extended through the slot of the left latch, the through hole is aligned with the left locking hole, and the screw aperture of the right fastener is aligned with the through aperture of the right latch.

7. The adjustable device as claimed in claim 4, wherein when the right fastener is extended through the slot of the right latch, the through hole is aligned with the right locking hole, and the screw aperture of the left fastener is aligned with the through aperture of the left latch.

8. The adjustable device as claimed in claim 5, wherein the securing plate defines at least one cutout, and the supporting plate comprises at least one spring tab received in the at least one cutout.

9. The adjustable device as claimed in claim 8, wherein the securing plate further comprises a body having a rear double-thickness portion, and the at least one cutout is defined in the double-thickness portion.

10. The adjustable device as claimed in claim 9, wherein the securing plate further comprises three strips arranged at left, right and front side edges of the body.

11. The adjustable device as claimed in claim 1, wherein the supporting plate further comprises a pair of positioning blocks for facilitating positioning of the securing plate on the supporting plate.

12. An adjustable device assembly comprising:
a circuit board on one face of which an electrical component is mounted;
a retention module secured on said one face of the circuit board surrounding the electrical component;
a heat sink surrounded by the retention module and attached on the electrical component; and
a securing device comprising:
  a supporting plate comprising a plurality of latches; and
  a securing plate secured with the retention module and disposed on an opposite face of the circuit board, the securing plate comprising a plurality of fasteners corresponding to the latches,
  wherein the securing plate can be adjustably secured to the supporting plate by a selected one of the fasteners being engaged with a selected corresponding latch, thereby providing flexibility of positioning of the circuit board.

13. The adjustable device assembly as claimed in claim 12, wherein the supporting plate further comprises a locking block defining a plurality of locking holes corresponding to the number of latches, and the securing plate defines a through hole, and wherein when a selected one of the fasteners is engaged with a selected corresponding latch, a screw is extended through the through hole and engaged in a corresponding locking hole.

14. The adjustable device assembly as claimed in claim 13, wherein each of the fasteners defines a screw aperture, and each of the latches defines a through aperture, whereby a screw can be extended through a selected through aperture and engaged in a corresponding screw aperture.

15. The adjustable device assembly as claimed in claim 13, wherein the plurality of latches comprises a front latch, a left latch and a right latch, the plurality of fasteners comprises a front fastener, a left fastener and a right fastener, the plurality of locking holes comprises a middle locking hole, a left locking hole and a right locking hole, and the middle locking hole is disposed forwardly of the left and right locking holes.

16. The adjustable device assembly as claimed in claim 15, wherein when the electrical component is located on the circuit board in an intermediate position, the front fastener is selected to engage with the front latch.

17. The adjustable device assembly as claimed in claim 15, wherein when the electrical component is offset slight leftward on the circuit board, the left fastener is selected to engage with the left latch.

18. The adjustable device assembly as claimed in claim 15, wherein when the electrical component is offset slightly rightward on the circuit board, the right fastener is selected to engage with the right latch.

19. An adjustable device assembly comprising:
a printed circuit board;
at least one electronic component seated upon the printed circuit board;
a supporting plate positioned under the printed circuit board, said supporting plate including three locking latches defining three sides of a rectangular configuration;
a securing plate positioned between said supporting plate and said printed circuit board, and secured to said printed circuit board, said securing plate being moveable in a direction defining one of three different positions relative to the support plate while constantly retained by said three locking latches which abut against three sides of the securing plate; wherein
at least one fastening element fastens one side of said securing plate to the supporting plate.

* * * * *